(12) United States Patent
Van Der Laan et al.

(10) Patent No.: US 7,382,438 B2
(45) Date of Patent: Jun. 3, 2008

(54) LITHOGRAPHIC APPARATUS AND DEVICE MANUFACTURING METHOD

(75) Inventors: Hans Van Der Laan, Veldhoven (NL); Johannes Anna Quaedackers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 187 days.

(21) Appl. No.: 11/209,032

(22) Filed: Aug. 23, 2005

(65) Prior Publication Data

US 2007/0046920 A1   Mar. 1, 2007

(51) Int. Cl.
*G03B 27/72* (2006.01)
*G03B 27/54* (2006.01)
*G03B 27/42* (2006.01)

(52) U.S. Cl. .............................. 355/69; 355/67; 355/53
(58) Field of Classification Search ................. 355/53, 355/67, 69; 430/322
See application file for complete search history.

(56) References Cited

U.S. PATENT DOCUMENTS

| | | | | |
|---|---|---|---|---|
| 5,526,093 A | * | 6/1996 | Takahashi | 355/53 |
| 5,831,715 A | * | 11/1998 | Takahashi | 355/53 |
| 5,925,887 A | * | 7/1999 | Sakai et al. | 250/548 |
| 2001/0026448 A1 | * | 10/2001 | Koizumi et al. | 362/268 |
| 2003/0197842 A1 | * | 10/2003 | Tsacoyeanes et al. | 355/53 |
| 2005/0100831 A1 | * | 5/2005 | Finders et al. | 430/322 |
| 2005/0146704 A1 | * | 7/2005 | Gruner et al. | 355/71 |
| 2005/0243299 A1 | * | 11/2005 | Spence et al. | 355/69 |

OTHER PUBLICATIONS

Flagello et al., Optimizing and Enhancing Optical Systems to Meet the Low k1 Challenge., Optical Microlithography XVI, Proceedings of SPIE Vo. 5040, (2003), pp. 139-150.

* cited by examiner

*Primary Examiner*—Peter B Kim
(74) *Attorney, Agent, or Firm*—Pillsbury Winthrop Shaw Pittman, LLP

(57) ABSTRACT

A lithographic apparatus having a controller that sets at least one lithographic apparatus parameter such that the difference between the critical dimension of pattern features formed on the substrate in regions of relatively high and relatively low pattern feature density is minimized for an area on the substrate on which a patterned beam of radiation is to be projected and which re-sets the at least one lithographic apparatus parameter during a time period between the times of projection of the patterned radiation beam onto two areas of the substrate.

18 Claims, 2 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Microchip fabrication involves the control of tolerances of a space or a width between features, and/or between elements of a feature such as, for example, two edges of a feature. In particular, the control of space tolerance of the smallest of such spaces permitted in the fabrication of the device or IC layer is of importance. Said smallest space and/or smallest width is commonly referred to as the critical dimension ("CD").

In order for the devices formed by the lithographic process to function correctly and consistently, it is important to ensure that the CD of a completed device or part of a completed device is as close as possible to a desired value. It is also important to ensure that the CD value varies as little as possible between devices formed on different substrates, between devices formed on different parts of a single substrate and between different parts of a single device. The CD may vary between substrates and across substrates, however, because of variations in the processing conditions of the resist on the substrate, for example. The inherent CD variation may be compensated for by adjusting the dose applied to the substrate.

However, it has also been found that the CD may vary between features formed on the same part of the substrate. In particular there may be a difference in the CD of isolated features (namely features formed on the substrate in regions of relatively low pattern feature density) and dense features (namely features formed in regions of relatively high pattern feature density). These variations may limit the process latitude, i.e. the available depth of focus in combination with the allowed amount of residual error in the dose of exposure of irradiated target portions for a given tolerance of the CD. This problem arises because features of the patterning device having the same nominal critical dimensions may print differently depending on their pitch (i.e. the separation between adjacent features) due to pitch dependent effects. For example, the feature consisting of a line having particular line width when in isolation, i.e. having a large pitch, will print differently from the same feature having the same line width when together with other lines of the same line width in a dense arrangement on the patterning device, i.e. having a small pitch. Hence, when both dense and isolated features of critical dimension are to be printed simultaneously, a pitch dependent variation of printed CD is observed. This phenomenon is called "iso-dense bias".

The iso-dense bias may be caused by diffraction effects, which result is radiation reaching the substrate at locations other than those intended. The separation between two adjacent pattern features, namely the pitch, affects the impact of stray radiation from one pattern feature on the printing of an adjacent pattern feature. In addition, the overall intensity of the radiation projected onto the substrate may affect the iso-dense bias. In addition, substrate processing steps external to the lithographic apparatus, such as resist coating, resist development and etching, for example, can introduce an iso-dense bias in the pattern features formed on the substrate. In such chemical processing steps, the iso-dense bias is caused by the different concentrations of the reactive species in the isolated and dense pattern regions.

SUMMARY

It is desirable to provide a lithographic system in which accurate and consistent patterns may be formed on the substrate.

According to an aspect of the invention, there is provided a lithographic apparatus including an illumination system configured to condition a radiation beam, a support structure constructed to support a patterning device, the patterning device being capable of imparting the radiation beam with a pattern in its cross-section to form a patterned radiation beam, a substrate table constructed to support a substrate, a projection system configured to project the patterned radiation beam onto a target portion of the substrate, a controller configured to control at least one system parameter, wherein said controller is configured to set said at least one system parameter such that the difference between the critical dimension of pattern features formed on the substrate in regions of relatively high and relatively low pattern feature density is minimised for the area on the substrate in which the target portion is located, and the controller is configured to re-set said at least one system parameter between the projection of the patterned radiation beam onto two areas of substrate.

According to an aspect of the invention, there is provided a lithographic apparatus including, an illuminator configured to condition a radiation beam, a support constructed to support a patterning device, the patterning device being capable of imparting the radiation beam with a pattern in its cross-section to form a patterned radiation beam, a substrate table constructed to support a substrate, a projection system configured to project the patterned radiation beam onto a target portion of the substrate, and a controller configured to control at least one system parameter which affects the iso-dense bias of the pattern formed on the substrate, wherein the controller is configured to change said at least one system parameter between the projection of the patterned radiation beam onto first and second target portions on the substrate.

According to an aspect of the invention, there is provided a device manufacturing method setting at least one system parameter such that the difference between the critical dimension of pattern features formed on a substrate in regions of relatively high and relatively low pattern density is minimised for an area on the substrate, projecting a patterned beam of radiation onto said area on the substrate, re-setting said at least one system parameter in order to minimise the difference between the critical dimension of pattern features formed on a substrate in regions of relatively high and relatively low pattern feature density for a second area on the substrate, and projecting a patterned beam of radiation onto said second area on the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
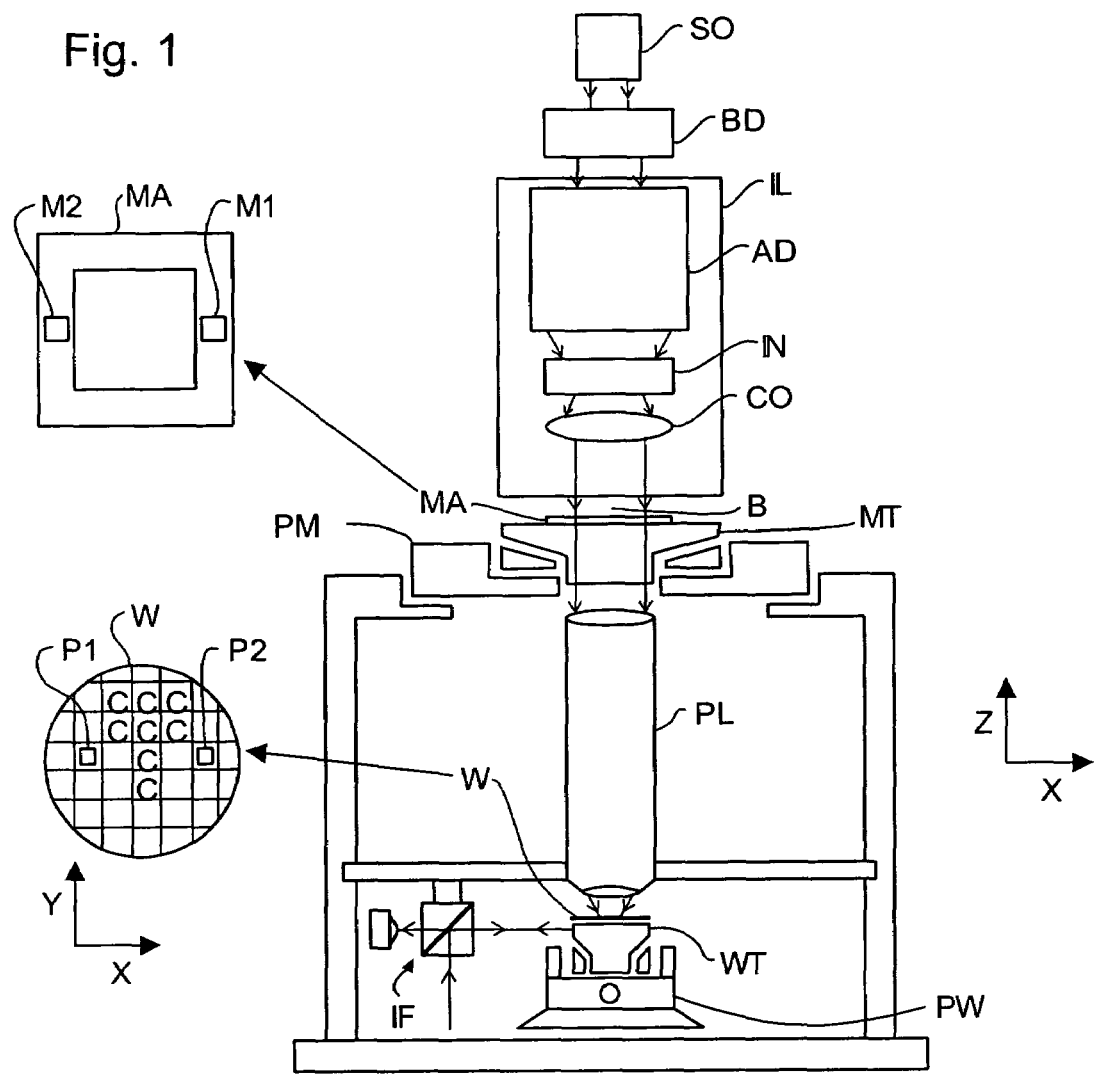
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation such as, for example, excimer laser radiation having a wavelength of 248 nm or 193 nm).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The forming of pattern features on the substrate involves lithographic process steps both prior to exposure and after exposure. The substrates may be subjected to a variety of processes before the lithographic apparatus exposes a reticle circuit pattern onto the substrate. Before exposure, the substrate is coated with a target layer to be patterned, such as for example a doped polysilicon layer. After this deposition, the substrates may be treated or coated with a layer of photo-activated resist (i.e. photoresist) material before exposure. Moreover, prior to exposure, the substrates may also be subjected to cleaning, etching, ion implantation (e.g., doping), metallization, oxidation, chemo-mechanical polishing, priming, and soft bake processes. The substrates may also be subjected to a host of post-exposure processes, such as, for example, post exposure bake (PEB), development, hard bake, etching, ion implantation (e.g., doping), metallization, oxidation, chemo-mechanical polishing, and cleaning. And, if several layers for each substrate are required, which is usually the case, the entire procedure, or variants thereof, will have to be repeated for each new layer.

Where in the present text and claims reference is made to a device or a pattern or a feature being "formed" or "formed on a substrate", said "formed" includes, besides execution of an exposure, the execution of one or more lithographic pre-exposure or post-exposure processing steps.

Any of the pre and post exposure processing steps can introduce an iso-dense bias in the pattern features formed on the substrate. In particular substrate processing steps external to the lithographic apparatus, such as resist coating, resist development and etching, for example, can introduce an iso-dense bias in the pattern features formed on the substrate. In such chemical processing steps, the iso-dense bias is caused by the different concentrations of the reactive species in the isolated and dense pattern regions. Concentrations of reactive species may not be uniform over either a die, or a substrate. Furthermore, concentrations of reactive species as well as the spatial uniformity of such concentrations may vary from substrate to substrate within a batch of substrates. Hereinafter, iso-dense bias due to pre and post exposure processing steps will also be referred to as an "inherent iso-dense bias" or an "inherent iso-dense bias variation".

Figure 2:
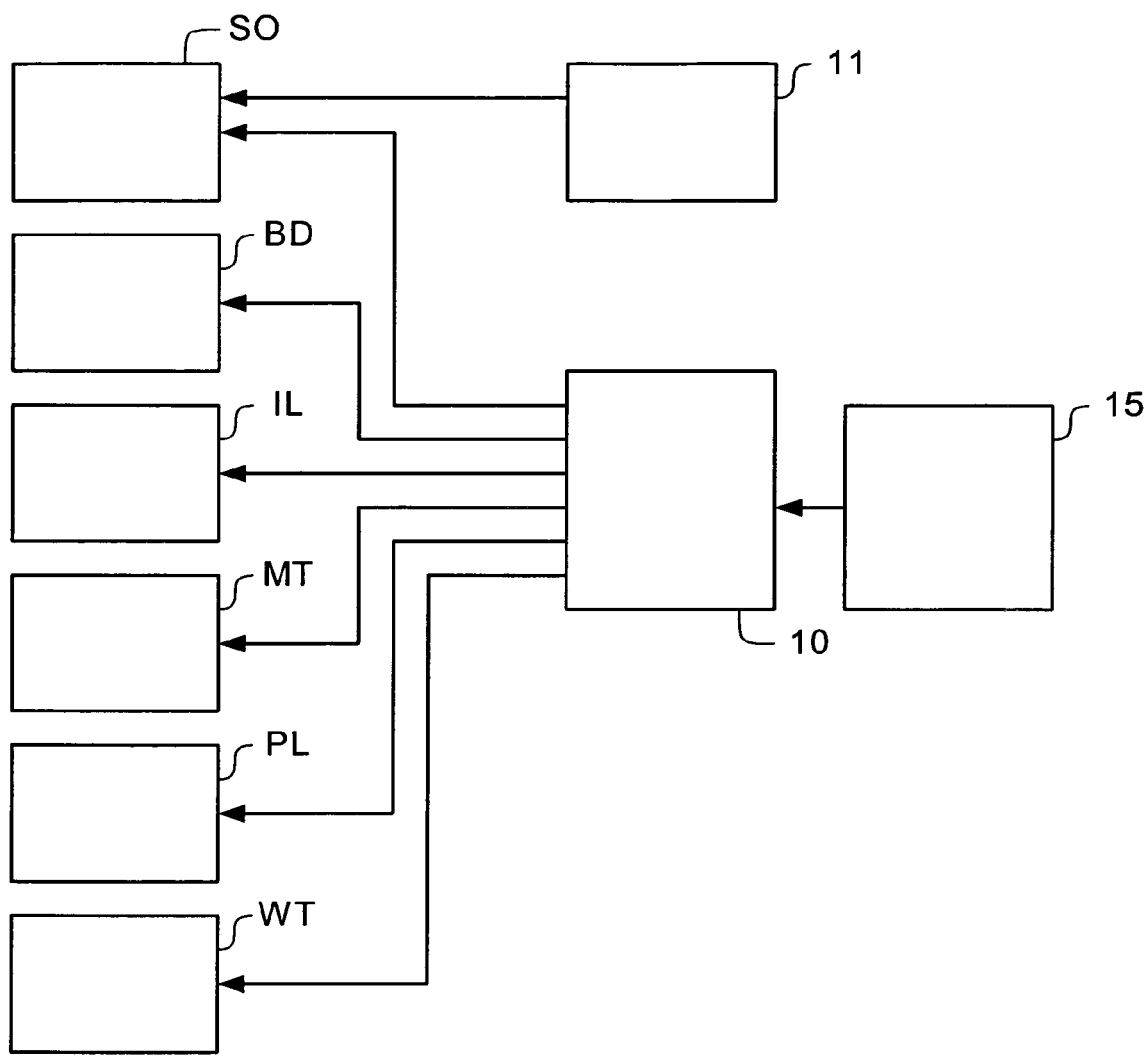
FIG. 2 depicts a control system according to the present invention.

As shown in FIG. 2, the lithographic apparatus comprises a controller 10 that can set at least one system parameter of the lithographic apparatus. As shown in FIG. 2, the system parameter may be a setting in the source SO, a setting of the beam delivery system BD, a setting in the illuminator IL, a setting of the mask table MT, a setting in the projection system PL and a setting of the substrate table WT or any combination of these. As described below, the system parameter(s) set by the controller 10, affects the iso-dense bias of the pattern of the device, or layer of the device, formed on the substrate. An adjustment of the system parameter(s) may either affect an offset of an iso-dense bias value, or it may affect a spatial distribution of an iso-dense bias value, or it may affect both. In other words, the controller 10, can set the system parameter such that the difference between the critical dimension of pattern features formed on the substrate in a region of relatively high pattern feature density and the critical dimension of pattern features formed on substrate in regions of relatively low pattern feature density is minimised. Minimizing the difference between the critical dimension of pattern features formed on the substrate in regions of relatively high and relatively low pattern feature density for an area on the substrate may include a pre-compensation of iso-dense bias due to a post-exposure process, by deliberately creating, in the exposed projected image, an iso-dense bias of opposite sign. For example, in the presence of an iso-dense bias contribution due to etching, the pattern in the resist will then show an iso-dense bias, however, the iso-dense bias after etch will be minimised. Alternatively, minimising said difference may include a post-compensation of iso-dense bias due to a pre-exposure process. The compensation may either be a spatially uniform compensation or a spatially non-uniform compensation.

In the apparatus of the present invention, the controller 10 is configured such that the system parameter can be re-set between the projection of patterned radiation beam onto one part of the substrate and the projection of the patterned beam onto a second part of the substrate. Accordingly, the setting of the system parameter can be optimized for each individual part of the substrate rather than merely being set, for example, for the complete exposure of the substrate or a batch of substrates. This ensures that the iso-dense bias is minimised for each part of the substrate. Accordingly, the lithographic apparatus can form devices as accurately possible, minimizing the variation of the iso-dense bias across substrate or from substrate to substrate, namely compensating for the inherent variation in the iso-dense bias.

The system parameter controlled by the controller 10 in order to minimise the iso-dense bias may be the degree of polarization of the beam of radiation. This may be set by controlling the relative intensity of a given state of polarization. This may be achieved by including a quarter wavelength plate, for example in the illuminator IL, the quarter wavelength plate is nominally orientated such that the birefringent crystal axis of the quarter wavelength plate is oriented parallel to one of the nominal polarization directions of the beam of radiation. A slight rotation of the quarter wavelength plate around the optical axis of the beam of radiation introduces an ellipticity on the polarization state of the beam of radiation, thus adjusting the degree of polarization of the beam of radiation.

The system parameter set by the controller 10 in order to minimise the iso-dense bias may alternatively or additionally be the intensity distribution of the beam of radiation in a pupil plane of the illuminator IL. For example, as discussed above, the illuminator IL may comprise an adjuster which can set the outer and/or inner radial extent of the intensity distribution. It will be appreciated that such intensity distribution settings may have an effect on the iso-dense bias and may be set by the controller 10 in order to minimise the iso-dense bias.

The system parameter set by the controller 10 in order to minimise the iso-dense bias may alternatively or additionally include the numerical aperture (NA) of the projection system. This may, for example, be changed by adjusting the aperture of a diaphragm located at the pupil plane of the projection system.

The system parameter set by the controller 10 in order to minimise the iso-dense bias may alternatively or additionally be the spectral distribution of the wavelength of the radiation in the beam of radiation. This may be set by a variety of means. The spectral distribution may be adjusted by adjusting the settings of the radiation source SO. The spectral distribution may alternatively or additionally be adjusted by the provision of two or more sources of radiation that have different spectral distributions and a system that adjusts the relative intensity of radiation that each contributes to the beam of radiation. Alternatively or additionally, the spectral distribution of the beam of radiation may be adjusted by the inclusion in the beam path of one or more tunable filters that attenuate radiation at a given wavelength or range of wavelength. It will be appreciated that other systems may alternatively or additionally be used to adjust the spectral distribution of the beam of radiation. For example, an excimer laser may be arranged and operated such that the radiation spectrum of the laser beam comprises two separate spectral peaks of intensity, whereby the spectral distance between the peaks and/or the relative magnitude of the peaks is adjustable. Both these system parameters may affect the iso-dense bias, when adjusted or changed.

The effect on iso-dense bias of above mentioned system parameters is typically to provide an off-set so the iso-dense bias, substantially spatially uniform over the exposed area of the substrate.

If the substrate is moved relative to the patterned beam of radiation being projected onto it during the exposure of a pattern feature, the image formed will be blurred. The effect of the blurring is to change the critical dimension of the pattern formed. This effect on the critical dimension is pitch dependent. Accordingly, the system parameter set by the controller 10 in order to minimize the iso-dense bias may alternatively or additionally control relative movement between the patterned beam of radiation and the substrate during an exposure. This may be effected by adjusting the position of at least one of the patterning device, the substrate and the projection system, or one or more optical elements of the projection system, or a part of the projection system, during an exposure. The effect on iso-dense bias of said relative movement may either be to provide an off-set to the iso-dense bias or to provide a spatially non-uniform change to the iso-dense bias. For example, a small rotationally oscillating relative movement around an optical axis of the projection system introduces a radially dependent, non-uniform iso-dense bias effect over the exposed area of the substrate.

The system parameter set by the controller 10 to minimize the iso-dense bias may alternatively or additionally introduce mis-adjustments in the projection system, for example, to lower the contrast of the image projected onto the substrate. For example, a field dependent amount of spherical aberration may be introduced to introduce a correspondingly field dependent iso-dense bias effect over the exposed area of the substrate. The effect of lowering the contrast, which is similar to the blurring discussed above is pitch dependent and can therefore be used to minimize the iso-dense bias.

It will be appreciated that other system parameters of one or more parts of the lithographic apparatus may be set by the controller 10 in order to minimise the iso-dense bias. Likewise, adjusting more than one system parameter at the same time may provide especially beneficial effects.

As shown in FIG. 2, the apparatus may further include an intensity controller 11 that is configured to adjust the intensity of the beam of radiation. As shown, this may be effected by providing a control signal to the radiation source SO in order to control the intensity of the radiation beam generated. Alternatively or additionally, however, the intensity controller 11 may control a variable attenuator, which may be arranged in any convenient portion of the apparatus, arranged to attenuate the beam of radiation or patterned beam of radiation in order to provide a desired intensity of the patterned beam of radiation projected onto the substrate. The control of the intensity of the beam of radiation may be used to adjust the critical dimension of the pattern features formed on the substrate. In particular, the intensity controller 11 may be configured such that the intensity of the beam of radiation may be re-set between the projection of the patterned radiation beam onto a first area of the substrate and the projection of the patterned radiation beam onto a second area of the substrate. Accordingly, the intensity of the patterned beam of radiation may be adjusted between substrates and across substrates in order to minimise the variation in the critical dimension of the patterns produced. It will be appreciated that references to the intensity of the patterned beam of radiation refer to the peak intensity of the patterned beam of radiation, namely a portion of the beam of radiation that has not been attenuated by the patterning device (for example, a portion corresponding to a bright feature or a bright background field in the projected image).

In general, therefore, the lithographic apparatus may include an intensity controller 11 configured to minimise the overall critical dimension variation across and between substrates, for example caused by process variations, and a controller 10 configured to minimise the variation in the critical dimension of the patterns formed caused by differences in the pitch of the pattern (namely differences caused by features being formed in a region of relatively high pattern feature density and features formed in regions of relatively low pattern feature density). It will be appreciated that the two controllers may be combined to form a single controller that performs both functions.

The lithographic apparatus may be constructed such that it can form the patterns necessary for a plurality of devices on each substrate. For example, as shown in FIG. 1, each of the plurality of target portions C on the substrate W may correspond to a single device. The controller 10 may be constructed such that the setting of the system parameter (or system parameters) may be re-set between the projection of the patterned beam of radiation onto a portion of the substrate corresponding to one device and the projection of the patterned beam of radiation onto a portion of the substrate corresponding to a second device. Accordingly, the iso-dense bias for each portion of the substrate, namely each device to be formed on the substrate, may be minimised. This is a significant improvement over the conventionally known devices in which the settings would be fixed for the entire substrate with the result that the settings could not be optimized for all of the devices being formed.

Alternatively or additionally, the controller 10 may be constructed such that the system parameter (or system parameters) set by the controller 10, may be re-set between the projection of the patterned beam onto a part of the substrate corresponding to a device to be formed and the projection of the patterned beam onto a second part of the substrate corresponding to a different part of the same device. Accordingly, the system parameter may be optimized across each device, further optimizing the uniformity of the critical dimension across the pattern corresponding to each device. In particular, in an apparatus operating in the scan mode, discussed above, the controller 10 may be constructed to re-set the system parameter (or system parameters) during the scanned exposure of the pattern. Again, this ensures that the setting of the system parameter can be optimized across the pattern corresponding to the device in order to minimise changes in the iso-dense bias across the pattern.

Furthermore, it will be appreciated that, regardless of the mode of use of the apparatus, as discussed above, at any one instant during the exposure of a pattern onto a substrate, an exposure field of a given size (corresponding to the area of the reticle which is illuminated by the beam of radiation B) will be projected onto the substrate. Therefore, the controller 10 may alternatively or additionally set the system parameter to induce a, preferably well-defined, iso-dense bias variation across the exposure field. Accordingly, the iso-dense bias of the final pattern formed can be optimized not only for each part of the pattern corresponding to an exposure field but also within each part of the pattern corresponding to an exposure field. For example, therefore, in an apparatus operating in the scan mode discussed above, the iso-dense bias can be optimized not only in the scanning direction but also in the non-scanning direction. This may be achieved, for example, by inducing a relative movement of the patterning device relative to the substrate during an exposure such that the relative movement is field position dependent.

It will be appreciated that, in the same manner as described above, the intensity controller 11 may be constructed to re-set the intensity of the beam of radiation projected on to the substrate between exposures on portions of the substrate corresponding to different devices and/or between exposures on areas of the substrate corresponding to different parts of the same device. In that manner, the variation across the substrate and/or across individual devices, can be minimised as well as minimizing the variation in the iso-dense bias.

The controller 10 may be associated with a memory 15 that stores the data necessary to set the system parameter (or system parameters). For example, the memory may store data corresponding to the settings required for the system parameter (or system parameters) for each area of the substrate. In particular, the settings stored for each area may correspond to those necessary in order to minimise the iso-dense bias for that area. Alternatively or additionally, the memory may store, for each area of the substrate, data corresponding to the difference between the critical dimension of pattern features formed on the substrate in regions of relatively high and relatively low pattern feature density for a plurality of different settings of the system parameter (or system parameters). Accordingly, the controller 10 can, by accessing the data in the memory 15, set the system parameter (or system parameters) to the appropriate setting for each area on the substrate in order to minimise the iso-dense bias.

It will be appreciated that in an apparatus having an intensity controller 11 as described above, the memory 15 may also store similar data for setting the intensity controller such that the critical dimension uniformity is optimized. Alternatively, or additionally, a separate memory may be provided for storing data for use by the intensity controller 11.

The data in the memory 15 may be generated by forming test patterns on a plurality of substrates with a variety of settings of the system parameter (or system parameters) controlled by the controller 10. The test patterns formed may then be inspected in order to determine the variation in the critical dimension and the iso-dense bias for each area on the substrate and for each setting used. From this, the appropriate data for the memory 15 can be generated. It will be appreciated that the response of the apparatus to different settings may vary over time. Accordingly, test substrates may be generated periodically and inspected and the data in the memory updated as necessary. Alternatively or additionally, the substrates on which devices are formed (or a sample thereof) may be inspected and the results of these inspections used to update the data in the memory 15 as necessary.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a support structure constructed to support a patterning device, the patterning device being capable of imparting the radiation beam with a pattern in the cross-section of the radiation beam to form a patterned radiation beam;
   a substrate table constructed to support a substrate;
   a projection system configured to project the patterned radiation beam onto a target portion of the substrate; and
   a controller configured to control at least one lithographic apparatus parameter,
   wherein said controller is configured to set said at least one lithographic apparatus parameter such that a difference between a critical dimension of pattern features formed on the substrate in regions of relatively high and relatively low pattern feature density is minimised for an area on the substrate in which the target portion is located, and
   the controller is configured to re-set said at least one lithographic apparatus parameter during a time period between the times of projection of the patterned radiation beam onto two areas of the substrate.

2. A lithographic apparatus according to claim 1, wherein said at least one lithographic apparatus parameter includes at least one of the numerical aperture of the projection system, the degree of polarization of the beam of radiation, the intensity distribution of the beam of radiation in a pupil plane of the illumination system, the spectral distribution of the wavelength of the radiation in the beam of radiation, a movement of the patterned radiation beam relative to the substrate during an exposure and the contrast of the image projected onto the substrate.

3. A lithographic apparatus according to claim 1, further comprising an intensity controller configured to set the intensity of the beam of radiation in order to provide a desired critical dimension of pattern features formed on the substrate in a region of relatively high pattern feature density, or a region of relatively low pattern feature density, or both regions,
   wherein said intensity controller is configured to re-set the intensity of the beam of radiation during the time period between the times of projection of the patterned radiation beam onto two areas of the substrate.

4. A lithographic apparatus according to claim 1, wherein the apparatus is constructed to form a plurality of devices on the substrate; and the controller is configured to re-set said at least one lithographic apparatus parameter during the time period between the times of projection of the patterned beam onto a first area corresponding to a first of said devices and of projection of the patterned beam onto a second area corresponding to a second of said devices.

5. A lithographic apparatus according to claim 1, wherein the apparatus is constructed to form a plurality of devices on the substrate; and the controller is configured to re-set said at least one lithographic apparatus parameter during the time period between the times of projection of the patterned beam onto a first area corresponding to a first portion of one of said devices and of projection of the patterned beam onto a second area corresponding to a second portion of said device.

6. A lithographic apparatus according to claim 1, wherein the support structure is constructed to move the patterning device relative to the beam of radiation during an exposure in order to successively expose different parts of a pattern provided by the patterning devices, and the controller is constructed to re-set said at least one lithographic apparatus parameter while the patterning device moves relative to the beam of radiation during said exposure.

7. A lithographic apparatus according to claim 1, wherein the controller is constructed to set said at least one lithographic apparatus parameter such that the lithographic apparatus parameter's effect on the difference between the critical dimension of pattern features formed on the substrate in regions of relatively high and relatively low pattern feature density is different at first and second parts of the substrate that are exposed simultaneously by the patterned beam of radiation.

8. A lithographic apparatus according to claim 1, further comprising a memory constructed to store data corresponding to settings required for said at least one lithographic apparatus parameter for a plurality of areas of the substrate in order to minimise said difference in the critical dimension of pattern features formed on the substrate in regions of relatively high and relatively low pattern feature density, wherein said controller is configured to use the data in said memory to set said at least one lithographic apparatus parameter.

9. A lithographic apparatus according to claim 1, further comprising a memory constructed to store data, for a plurality of areas of the substrate, corresponding to the difference between the critical dimension of pattern features formed on the substrate in regions of relatively high and relatively low pattern feature density for a plurality of difference settings for said at least one lithographic apparatus parameter, wherein said controller is configured to use the data in said memory to set said at least one lithographic apparatus parameter.

10. A lithographic apparatus comprising:

an illuminator system configured to condition a radiation beam;

a support constructed to support a patterning device, the patterning device being capable of imparting the radiation beam with a pattern in its cross-section to form a patterned radiation beam;

a substrate table constructed to support a substrate;

a projection system configured to project the patterned radiation beam onto a target portion of the substrate; and a controller configured to control at least one lithographic apparatus parameter which affects an iso-dense bias of the pattern formed on the substrate, wherein the controller is configured to change said at least one lithographic apparatus parameter during a time period between the times of projection of the patterned radiation beam onto first and second target portions on the substrate.

11. A controller for a lithographic apparatus constructed to expose a pattern on a substrate, said controller being configured to set at least one lithographic apparatus parameter of the lithographic apparatus such that a difference between the critical dimension of pattern features formed on the substrate in regions of relatively high and relatively low pattern feature density is minimized for an area on the substrate being exposed by the lithographic apparatus, and the controller is configured to re-set said at least one lithographic apparatus parameter during a time period between the times of exposure of two areas on the substrate.

12. A device manufacturing method comprising:

setting at least one lithographic apparatus parameter such that a difference between a critical dimension of pattern features formed on a substrate in regions of relatively high and relatively low pattern density is minimised for an area on the substrate;

projecting a patterned beam of radiation onto said area on the substrate;

re-setting said at least one lithographic apparatus parameter in order to minimise the difference between the critical dimension of pattern features formed on a substrate in regions of relatively high and relatively low pattern feature density for a second area on the substrate; and projecting a patterned beam of radiation onto said second area on the substrate.

13. A method according to claim 12, wherein said area and said second area correspond to one of the group of pairs of areas consisting of two different areas of a die, two different areas of a target portion, two different dies on the substrate and two different target portions on the substrate.

14. A method according to claim 12, wherein said setting and said re-setting provide a compensation of an iso-dense bias of the critical dimension due to a pre-exposure or post-exposure lithographic process.

15. A computer program, embodied in a tangible medium, which computer program, when executed on a computer system, instructs a lithographic apparatus to perform a method, the method comprising:

setting at least one lithographic apparatus parameter such that a difference between a critical dimension of pattern features formed on a substrate in regions of relatively high and relatively low pattern density is minimised for an area on the substrate;

projecting a patterned beam of radiation onto said area on the substrate;

re-setting said at least one lithographic apparatus parameter in order to minimise the difference between the critical dimension of pattern features formed on a substrate in regions of relatively high and relatively low pattern feature density for a second area on the substrate; and projecting a patterned beam of radiation onto said second area on the substrate.

16. A device manufacturing method comprising:

setting at least one lithographic apparatus parameter such that a difference between a critical dimension of pattern features formed on a first substrate in regions of relatively high and relatively low pattern density is minimised for an area on the substrate;

projecting a patterned beam of radiation onto said area on the first substrate;

re-setting said at least one lithographic apparatus parameter in order to minimise the difference between the critical dimension of pattern features formed on a second substrate in regions of relatively high and relatively low pattern feature density for a second area on the substrate; and projecting a patterned beam of radiation onto said second area on the second substrate.

17. A method according to claim 16, wherein said setting and said re-setting provide a compensation of an iso-dense bias of the critical dimension due to a pre-exposure or post-exposure lithographic process.

18. A computer program, embodied in a tangible medium, which computer program, when executed on a computer system, instructs a lithographic apparatus to perform a method, the method comprising:
- setting at least one lithographic apparatus parameter such that a difference between a critical dimension of pattern features formed on a first substrate in regions of relatively high and relatively low pattern density is minimised for an area on the substrate;
- projecting a patterned beam of radiation onto said area on the first substrate;
- re-setting said at least one lithographic apparatus parameter in order to minimise the difference between the critical dimension of pattern features formed on a second substrate in regions of relatively high and relatively low pattern feature density for a second area on the substrate; and
- projecting a patterned beam of radiation onto said second area on the second substrate.

* * * * *